(12) United States Patent
Bozler et al.

(10) Patent No.: US 8,432,239 B2
(45) Date of Patent: Apr. 30, 2013

(54) MICRO-ELECTRO MECHANICAL TUNNELING SWITCH

(75) Inventors: Carl O. Bozler, Waltham, MA (US); Craig L. Keast, Groton, MA (US); Jeremy Muldavin, Westford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 571 days.

(21) Appl. No.: 11/943,146

(22) Filed: Nov. 20, 2007

(65) Prior Publication Data

US 2008/0135386 A1 Jun. 12, 2008

Related U.S. Application Data

(60) Provisional application No. 60/866,491, filed on Nov. 20, 2006.

(51) Int. Cl.
*H01H 51/22* (2006.01)

(52) U.S. Cl.
USPC .............................. 335/78; 200/181

(58) Field of Classification Search ...... 335/78; 200/181
See application file for complete search history.

(56) References Cited

U.S. PATENT DOCUMENTS

| | | | | |
|---|---|---|---|---|
| 6,307,169 B1 * | 10/2001 | Sun et al. | | 200/181 |
| 6,529,093 B2 * | 3/2003 | Ma | | 333/101 |
| 6,876,283 B1 * | 4/2005 | Weber et al. | | 335/78 |
| 6,876,482 B2 * | 4/2005 | DeReus | | 359/290 |
| 7,265,477 B2 * | 9/2007 | Wan | | 310/309 |
| 7,283,024 B2 * | 10/2007 | Bar et al. | | 335/78 |
| 7,463,125 B2 * | 12/2008 | Sridhar et al. | | 335/78 |
| 7,692,521 B1 * | 4/2010 | Cohn | | 200/181 |
| 2003/0045048 A1 * | 3/2003 | Marsh | | 438/218 |
| 2003/0227361 A1 * | 12/2003 | Dickens et al. | | 335/78 |
| 2004/0124497 A1 * | 7/2004 | Rottenberg et al. | | 257/532 |
| 2005/0121298 A1 * | 6/2005 | Sridhar et al. | | 200/181 |
| 2005/0190023 A1 * | 9/2005 | Nakatani et al. | | 335/78 |

(Continued)

FOREIGN PATENT DOCUMENTS

| | | |
|---|---|---|
| WO | 02079076 | 10/2002 |
| WO | 20070078589 | 7/2007 |

OTHER PUBLICATIONS

Simmons, John G. "Generalized Formula for the Electric Tunnel Effect between Similar Electrodes Separated by a Thin Insulating Film" Journal of Applied Physics, vol. 34, No. 6, Jun. 1963, pp. 1793-1803.

(Continued)

*Primary Examiner* — Bernard Rojas
(74) *Attorney, Agent, or Firm* — Gesmer Updegrove LLP

(57) ABSTRACT

A micro-electromechanical system switch includes a substrate and a plurality of actuating electrodes formed the substrate wherein each actuating electrode is activatable. A cantilever beam has a first end and a second end and a plurality of stops formed thereon. The plurality of stops engages the substrate between the plurality of actuating electrode. A contact area is formed in the substrate and located to engage the second end of the cantilever beam. A voltage source applies a voltage to each actuating electrode independently in a sequence from an actuating electrode located adjacent to the first end of the cantilever beam to an actuating electrode located adjacent to the second end of the cantilever beam so that the plurality of stops sequentially engage the substrate between the plurality of actuating electrodes.

60 Claims, 13 Drawing Sheets

U.S. PATENT DOCUMENTS

| | | |
|---|---|---|
| 2005/0219016 A1 | 10/2005 | Chou et al. |
| 2006/0012940 A1* | 1/2006 | Song et al. ............... 361/234 |
| 2006/0181379 A1* | 8/2006 | Schwartz et al. ........... 335/78 |
| 2007/0273463 A1* | 11/2007 | Yazdi ...................... 335/78 |

OTHER PUBLICATIONS

Needs et al., "Calculations of the surface stress tensor and surface energy of the (111) surfaces of iridium, platinum and gold" J. Phys. Condens. Matter 1 (1989) pp. 7555-7563.

Umemoto et al., "The Behavior of Surface Oxide Film on Ruthenium and Rhodium Plated Contacts" IEEE Transactions on Components, Hybrids, and Manufacturing Technology, vol. CHMT-1, No. 1, Mar. 1978, pp. 103-107.

Kogut et al. ,"Electrical contact resistance theory for conductive rough surfaces separated by a thin insulating film" Journal of Applied Physics, vol. 95, No. 2, Jan. 2004, pp. 576-585.

Wu et al.,"Coadsorption of oxygen, gold and carbon monoxide on Ru(0001) and $CO_2$ formation: A thermal desorption study" Surface Science 588(2005) pp. 117-126.

Chan et al., "Effect of Plasma Treatment of Au-Ni-Cu Bond Pads on Process Windows of Au Wir Bonding" IEEE Transactions on Advanced Packaging, vol. 28, No. 4, Nov. 2005, pp. 674-684.

Sharma et al., "Oxidation of Ruthenium" IEEE Transactions on Components, Hybrids, and Manufacturing Technology, vol. CHMT-6, No. 1., Mar. 1983, pp. 89-92.

Jehn, Herman, "High Temperature Behavior of Platinum Group Metals in Oxidizing Atmospheres" Journal of Less Common Metals 100, 1984, pp. 321-339.

Chen et al., "AFM-based Testing and Measurements of Contact and Stiction in a Micromechanical Switch" Proceedings of 2004 ASME/STLE International Joint Tribology Conference, Oct. 2004, pp. 1-4.

Raiber et al., "Removal of self-assembled monolayers of alkanethiolates on gold by plasma cleaning" Surface Science 2005, pp. 56-63.

Lin, Yeng-Su, "A surface analysis on oxygen plasma-cleaned gold pattern-plated substrates for wire bondability" Surface and Coatings Technology 173 (2003) pp. 47-57.

McGruer et al., "Mechanical, Thermal, and Material Influences on Ohmic-Contact-Type MEMS Switch Operation" MEMS 2006, Istanbul, Turkey, Jan. 2006, pp. 22-26.

Lee et al., "Characterization of metal and metal allo films as contact materials in MEMS switches" Institute of Physics Publishing, Journal of Micromechanics and Microengineering, 2006, pp. 557-563.

Miedzinski et al., "Analytical and Experimental Investigations of Reed Contact Bouncing" IEEE Transactions on Components, Hybrids, and Manufacturing Technology, vol. 11, No. 2, Jun. 1988, pp. 200-210.

Kwiatkowski, Regina et al. "High Contact Resistance Readings on Clean Microwave Mobile Contacts" Electrical Contacts, 2004. Proceedings of the 50th IEEE Holm Conference on Electrical Contacts and the 22nd International Conference on Electrical Contacts, Sep. 2004, pp. 160-167.

Dickrell, Daniel et al. "The Effects of Surface Contamination on Resistance Degradation of Hot-Switched Low-Force MEMS Electrical Contacts" Electrical Contact, 2004. Proceedings of the Fify-First IEEE Holm Conference on Sep. 2005, pp. 255-258.

Timsit, R.S. "Electical Conduction Through Small Contact Spots" Components and Packaging Technologies, IEEE Transactions, Dec. 2006, vol. 29, No. 4, pp. 727-734.

Johler, Erner. "Precious Metal-Reduced Contact Materials in Telecom- and Signal Relays" Electrical Contacts, 2001. Proceedings of the Forty-Seventh IEEE Holm Conference, pp. 104-116.

Tamai, Terutaka et al. "Application of Ag-Pd-Mg New Contact Material to Micro Relays" Electrical Contacts, 2004. Proceedings of the 50th IEEE Holm Conference on Electrical Contacts and the 22nd International Conference on Electrical Contacts, pp. 467-473.

* cited by examiner

MICRO-ELECTRO MECHANICAL TUNNELING SWITCH

PRIORITY INFORMATION

This application claims priority from U.S. Provisional Patent Application Ser. No. 60/866,491, filed on Nov. 20, 2006. The entire content of U.S. Provisional Patent Application, 60/866,491, filed on Nov. 20, 2006, is hereby incorporated by reference.

This invention was made with government support awarded by the United States Air Force under Contract No. FA8721-05-C-0002. The government has certain rights in the invention.

BACKGROUND

Conventionally, micro-electromechanical system (MEMS) DC switches are relatively large in order to develop the large contact and return forces to provide a low resistance contact. These switches are often made from relatively massive gold cantilever or bridge structures having a large plate area for applying a force with an electric field from an actuation electrode from below. At the edge of the plate, one or more moving contacts, which necessarily can have a fairly high impact force when actuated into the fixed contact below, are located. There is usually a snap action to the actuation because of the physical effect of actuation where the force increases quadratically, whereas the cantilever spring return force increases linearly.

To mitigate these effects, significant interventions using extra electronics in the actuation circuit, for example, are often used to improve reliability and performance. Even with these interventions, there is a great tendency for the contacts to bounce, which is highly undesirable.

The bouncing induces other resonances in the structure, for example lateral vibrations because of insufficient lateral stiffness which can cause contact scraping. In addition, the large forces and impact tend to deform or otherwise move the contact metal on the contact surface with each actuation. The metal movement is necessary to achieve a large enough contact area and achieve a low contact resistance. This metal movement can also create micro-welds which are broken when the switch is opened. The moving of the metal of the contact is then an integral part of the switch achieving a low resistance since the surface is naturally too rough for intimate contact.

The contact pressure moves the metal to make the contact surfaces conformal and more intimate. When the contact opens, the breaking of the micro-welds will then cause the surface to roughen again. There may also be material transfer from one contact to another. This situation is not conducive to long term reliability.

However, by reducing the size, and therefore the mass of the micro-electromechanical system switch, changing the movement of the actuating cantilever, increasing the lateral stiffness, and improving the smoothness of the contact surface to atomic dimensions, the performance of a micro-electromechanical system switch can be greatly improved.

On the other hand, the MOSFET and other types of transistors have reached such high levels of development that the fundamental limits are beginning to block further development. The limits are related to semiconductors and insulator materials, which place limits in the ability to create thin barriers and high carrier densities.

The micro-electromechanical system switch approach allows the use of metals, having very high carrier densities, and actual modulatable physical gaps, which can have atomic dimensions. Even very small gaps of 2 nm between metal electrodes can have very large resistances. Reducing the gap to 0.5 nm can reduce the resistance many orders of magnitude. Therefore, one can achieve orders of magnitude larger transconductance with a micro-electromechanical system switch.

The conventional concept that micro-electromechanical system devices are too slow to compete with conventional transistors is mitigated when the distance moved is extremely small and the gain produced is extremely large.

Therefore, it is desirable to provide a micro-electromechanical system switch having electrodes that never come into intimate contact, but maintain a separation; for example, a separation of at least 0.5 nm. This separation allows the switch to operate as a contactless switch, thereby avoiding stiction or wear issues.

However, as noted above, one of the major issues with contacts in micro-electromechanical system switches is that the surfaces of the contacts tend to accumulate water and hydrocarbons. Not only is this an issue for all micro-electromechanical system switch designs, but when making a micro-electromechanical system having the desired contactless feature described above, the accumulation of water and hydrocarbons on the surfaces of the contacts is a particularly serious problem since it will only take a couple of mono layers before the gap is totally filled in the closed position and the device may no longer switch. In addition, the small gap of such a micro-electromechanical system switch has an especially large attraction for molecules.

Therefore, it is further desirable to provide a micro-electromechanical system switch having electrodes that never come into intimate contact in an environment which essentially prevents the accumulation of water and hydrocarbons in the separation gap.

BRIEF DESCRIPTION OF THE DRAWINGS

The drawings are only for purposes of illustrating embodiments and are not to be construed as limiting, wherein.

DETAILED DESCRIPTION

Figure 1:
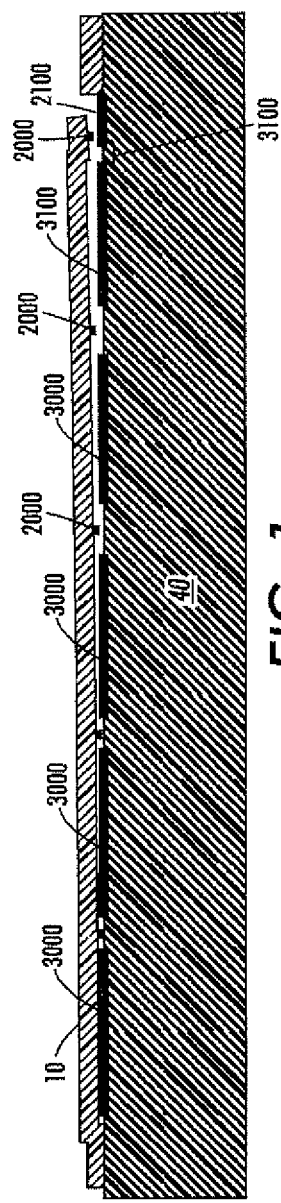
FIG. 1 illustrates a cross-section of an opened DC switch.

For a general understanding, reference is made to the drawings. In the drawings, like reference have been used throughout to designate identical or equivalent elements. It is also noted that the various drawings may not have been drawn to scale and that certain regions may have been purposely drawn disproportionately so that the features and concepts could be properly illustrated.

As discussed above, it is desirable to provide a micro-electromechanical system switch having electrodes that move together in stages so that the final movement into contact is small relative to the full excursion of the cantilever. An example of such a micro-electromechanical system switch is illustrated in FIG. 1. As Illustrated in FIG. 1, the micro-electromechanical system switch is fully open.

The base or substrate 40 for the switch could be silicon with a thermal oxide film covering it, thereby providing basically an insulating substrate. The micro-electromechanical system switch includes a multi-metal cantilever 10 having thereon a plurality of stop points 2000. It is noted that FIG. 1 shows the stop points 2000 located on the cantilever 10. However, the stop points 2000 could also be provided on the substrate 40. The stop points 2000 could be made from a metal or and insulator.

The multi-metal cantilever 10 may be constructed of a single layer metal or layers of different metals to achieve the properties desired. Considerations for metal properties are resistivity, density, chemical properties, elasticity, and strength.

An example of a combination of metals would be titanium for strength high elasticity and low density and aluminum for low resistivity, high elasticity, and low density. The titanium layers would sandwich aluminum above and below. Platinum, gold, ruthenium, rhodium, iridium (and their oxides) and other noble metals could be added in a layer or in local areas for both the fixed and moving contacts. The cantilever 10 of FIG. 1 is curved from a first end where it is anchored to the substrate 40 to a second end which forms the moving contact. It is noted that the cantilever 10 can also have a smaller amount of curvature in a direction orthogonal to the curvature from a first end to the second end.

The micro-electromechanical system switch also includes a plurality of pull down electrodes 3000, including a last pull down electrode 3100. The pull down electrodes 3000 may be constructed of tantalum nitride or almost any other conductor. It is further noted that each pull down electrode 3000 may provide independent actuation or be connected together to operate as a unit.

Lastly, micro-electromechanical system switch includes a fixed contact 2100. Contact 2100 may be constructed of rhodium (or ruthenium and ruthenium oxide or any of the noble metals and the stable noble metal oxides thereof) with an optional anti-stick layer. The fixed contact could be the same metal or a different metal than the moving contact. The optional anti-stick layer may consist of a silicon dioxide monolayer. The anti-stick layer may also consist of a monolayer layer of carbon or oxygen or both after cleaning.

Figure 2:
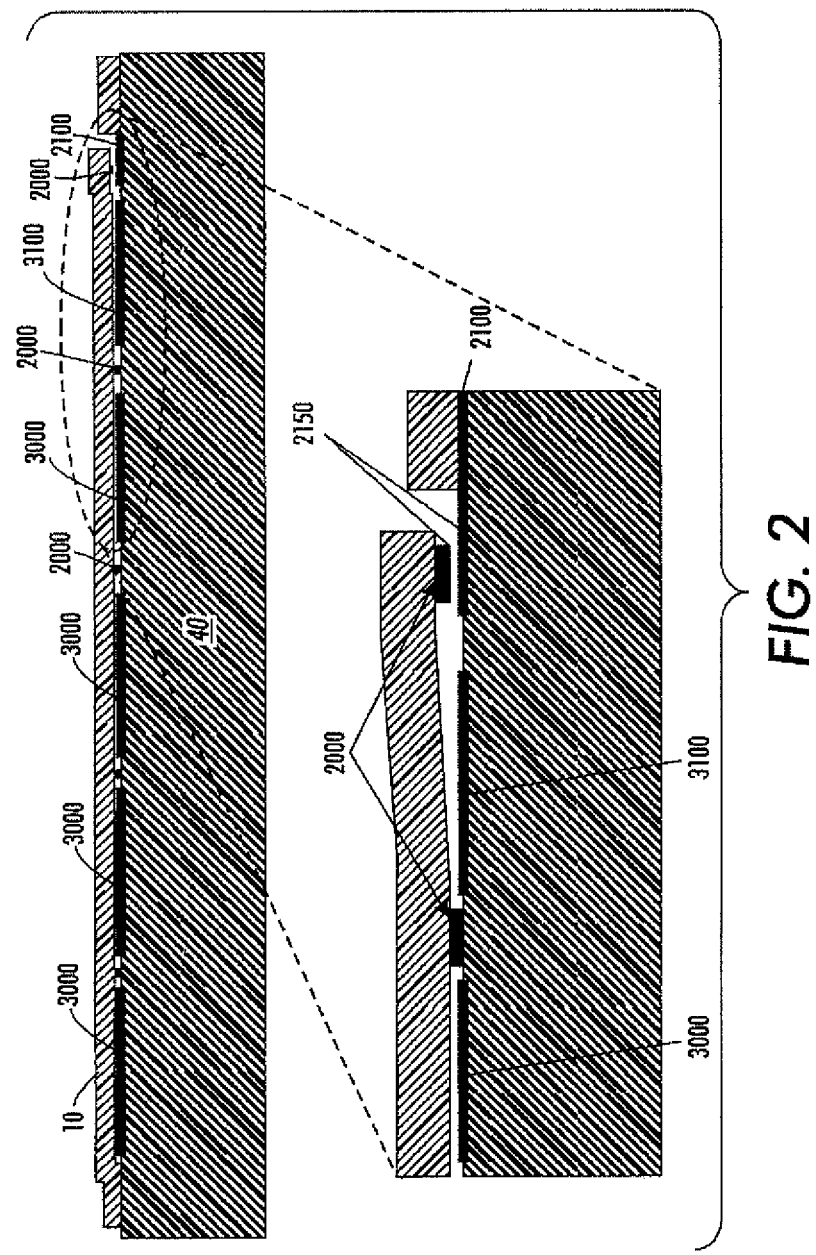
FIG. 2 illustrates a cross-section of a partially closed DC switch.

As Illustrated in FIG. 2, the micro-electromechanical system switch of FIG. 1 is partially closed. In this situation, the pull down electrodes 3000 have been actuated. However, the last pull down electrode 3100 has not been actuated, thereby enabling a small gap to be realized between the contacts of the micro-electromechanical system switch. If all the actuation electrodes are connected acting as one unit, FIG. 2 could also be considered a stop action showing the position at a moment in time just before the contact close.

This partial close state can best be seen in the magnified section of FIG. 2. As illustrated in the magnified section, the pull down electrodes 3000 have been actuated such that the stop point 2000, located between the illustrated pull down electrode 3000 and the last pull down electrode 3100, has engaged the substrate 40. Moreover, the last pull down electrode 3100 has not been actuated, thereby enabling a small gap 2150 to be realized between the fixed contact 2100 and moving stop point 2000 of the micro-electromechanical system switch.

Figure 3:
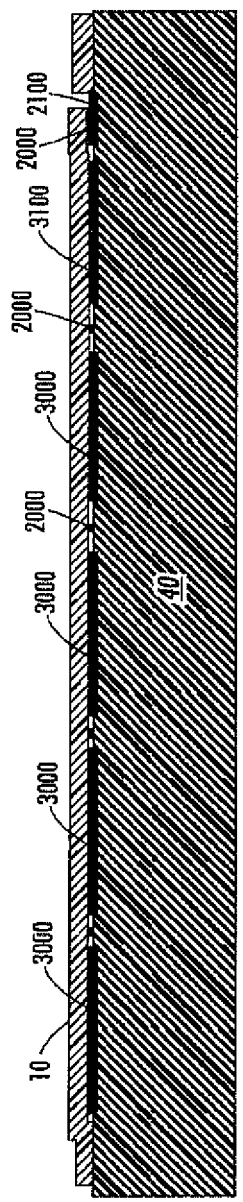
FIG. 3 illustrates a cross-section of a closed DC switch.

As Illustrated in FIG. 3, the micro-electromechanical system switch of FIG. 1 is fully closed. In this situation, the pull down electrodes 3000 have been actuated. Also, the last pull down electrode 3100 has been actuated.

It is noted that the separation 3150 between the last pull down electrode 3100 and the fixed contact 2100 is about one micron. Moreover, the separation between the pull down electrodes 3000 and the cantilever 10 is about one hundred nanometers.

Figure 4:
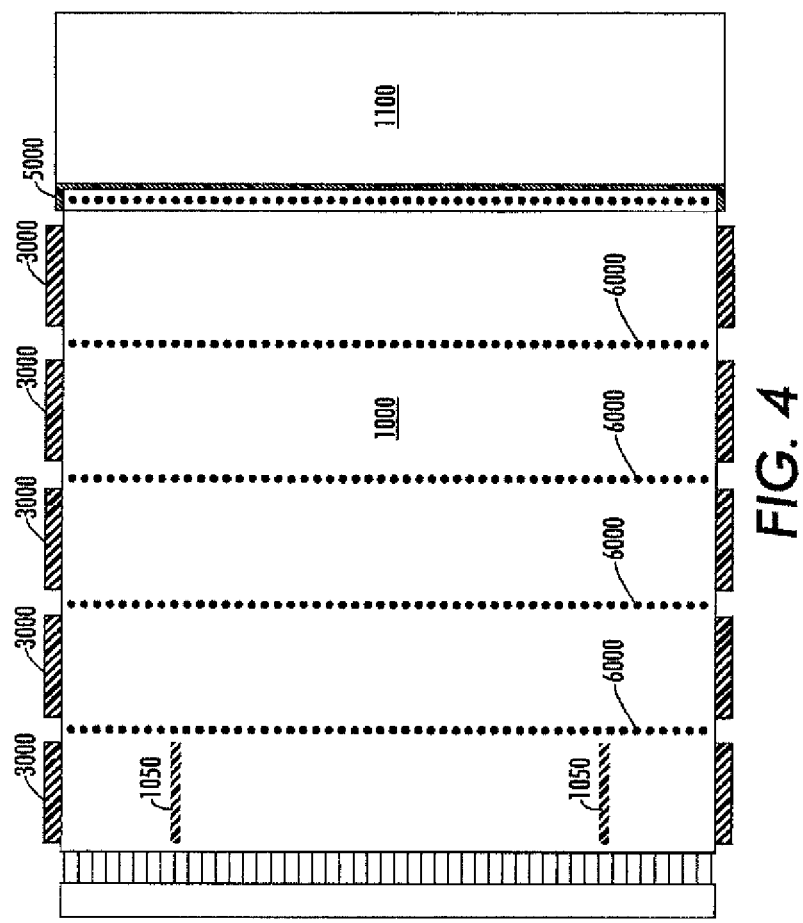
FIG. 4 illustrates a top-view of the DC switch of FIG. 1.

FIG. 4 illustrates a top-view of the micro-electromechanical system switch illustrated in FIGS. 1-3. As illustrated in FIG. 4, the micro-electromechanical system switch includes a multi-metal cantilever 1000 having thereon a plurality of stop points 6000. The plurality of stop points 6000 may be formed as a plurality of lines of dimples or a plurality of solid raised areas. The row of stop points (6000) at the end of the cantilever also serve as the moving contact. The size of the raised areas is in the range of 50 to 1000 nm in the diameter or lateral dimension and in the range of 5 to 500 nm high. The cantilever 1000 may also include slots or slits 1050 for providing strain relief.

The micro-electromechanical system switch also includes a plurality of pull down electrodes 3000, including a last pull down electrode 3100. The plurality of stop points 2000 may be formed in parallel to pull down electrodes 3000 and the last pull down electrode 3100. The stop points land in the gaps between the pull down electrodes with enough spacing to avoid shorting.

It is noted that the pull down electrodes may be connected together without slits. It is further noted that, to avoid shorting, the dimples, raised areas, or bumps may be made from an insulating material.

Lastly, micro-electromechanical system switch includes a fixed contact 5000 formed on a layer 1100. Contact 5000 may be constructed of rhodium (see above) with an optional anti-stick layer. The material making up the fixed contact may be different from the moving contact.

For the cantilever 10 of FIGS. 1-4, there is a 50 µNt to 100 µNt of spring return force. As described above, the independent actuation of the pull down electrodes enables the creation of an actuation force that bends the cantilever spring 10, and the actuation force is low enough to avoid deforming the cantilever 10, to cause it to collapse the cantilever between stop points.

By utilizing many small stops (stop points 2000), the actuation force of the cantilever 10 can be distributed more uniformly along the cantilever 10. Moreover, by actuating the cantilever 10 most of the way with the pull down electrodes 3000, the moving contact 2100 can be less than about 10-50 nm above the bottom contact just prior to final actuation by pull down electrode 3100. Actuating the final electrode 3100, in this manner, brings the contacts of the micro-electromechanical system switch together without bounce.

Figure 6:
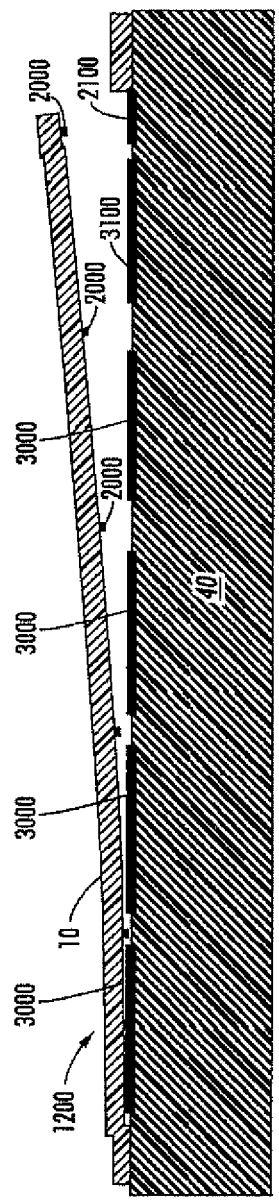
FIG. 6 illustrates a cross-section of an opened DC switch with variable curvature.

FIG. 6 illustrates a fully opened micro-electromechanical system switch having a variable curvature. The micro-electromechanical system switch includes a multi-metal cantilever 10 having thereon a plurality of stop points 2000. The plurality of stop points 2000 may be formed of platinum or ruthenium or other metals as described above. It is noted that FIG. 6 shows the stop points 2000 located on the cantilever 10. However, the stop points 2000 could also be provided on the substrate 40.

The multi-metal cantilever 10 may be constructed of a layer of (200 nm) titanium formed upon a layer of (600 nm) aluminum, which is formed upon a layer of (200 nm) titanium or a layer of (100 nm) titanium formed upon a layer of (800 nm) tungsten, which is formed upon a layer of (100 nm) titanium. It is noted that the area 1200 of cantilever 10 is thinner to provide an increased curvature and a lower spring constant. By varying the thickness of the cantilever 10, the cantilever 10 can achieve a greater impedance change by having the cantilever 10 rise up further to give a small off-state capacitance while still having a relatively low actuation voltage.

The micro-electromechanical system switch also includes a plurality of pull down electrodes 3000, including a last pull down electrode 3100. The pull down electrodes 3000 may be constructed of tantalum nitride. It is further noted that each pull down electrode 3000 may provide independent actuation.

Lastly, micro-electromechanical system switch includes a fixed contact 2100. Contact 2100 may be constructed of rhodium with an optional anti-stick layer. The anti-stick layer may consist of a silicon dioxide monolayer. The anti-stick layer may also consist of a monolayer layer of carbon or oxygen or both after cleaning.

In providing a micro-electromechanical system switch having a maximum achievable contact force of about 100 µNt, the contacts and actuator are designed to precisely control the contact movement and forces to avoid physical changes in the contacts while at the same time having low resistance and a large enough current carrying capacity. One approach to control the contact movement and forces in the contact area is to provide very smooth metal surfaces to avoid the random contact areas created by asperities.

When a micro-electromechanical system switch utilizes smooth surfaces on the contact, depending on the smoothness, the attractive force (when the surface of the bump or raised area is in contact with the smooth oxide surface of the substrate, or in contact with the fixed electrode) may dominate the spring return force and the moving and fixed contacts would stick together. By adding a very thin layer of fluoro polymer, less than 2 nm, or other non-stick coating to the surfaces, the surface energy is reduced. Moreover, the surface is roughened, thereby greatly reducing the stiction and allowing the spring force to dominate.

It is also noted that niobium surfaces can be been created to have smoothness to 0.7 nm RMS. It is noted that the attractive force between smooth metals is approximately 10 times larger than the attractive force between smooth insulators. Since the forces between metals are so large when the metals are in intimate contact, and since the resistance per unit area for metals in intimate contact is much lower than required for a current density less than 106 Amps/$cm^2$, there is an advantage if the contact is less intimate and a very small gap in the range of 0.5 to 2 nm between the metal contacts.

Figure 5:
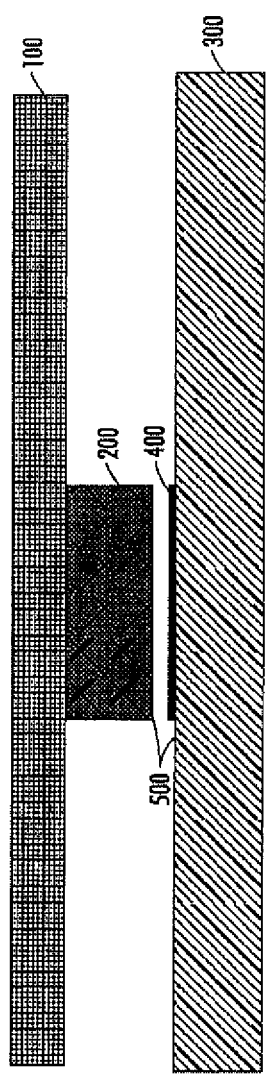
FIG. 5 illustrates a contact for a DC switch.

FIG. 5 illustrates an example of a contact where a thin $SiO_2$ layer provides the gap. As illustrated in FIG. 5, the contact includes an upper or cantilever structure 100, a contact structure 200, and a lower contact structure 300. Between the contact structure 200 and lower contact structure 300, thin anti-stick layer 400 is formed. It is noted that the surface roughness (500) may be less than 1 nm RMS.

The upper structure 100 may be constructed of titanium, and the lower structure 300 may be constructed of rhodium. The contact structure 200 may be constructed of gold or other noble metals such as platinum or a stable noble metal oxide. It is also noted that the thin anti-stick layer 400 may be constructed of $SiO_2$ or Teflon™.

It is noted that any layers of water, oxygen, and/or hydrocarbons can be effectively removed with an oxygen plasma or by atomic hydrogen.

As noted above, one issue with contacts in micro-electromechanical system switches is that the surfaces of micro-electromechanical system switches tend to accumulate water and hydrocarbons.

Figure 7:
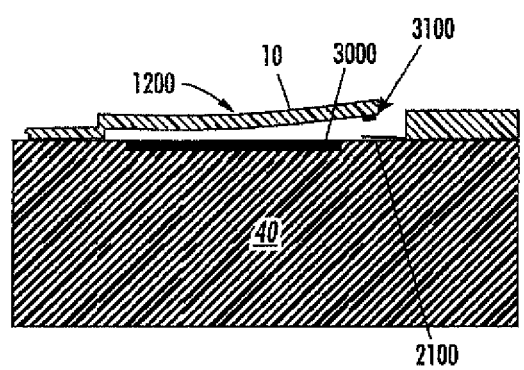
FIG. 7 illustrates a single stage version (a micro-electromechanical system tunneling transistor) of the switch in FIG. 1.

FIG. 7 is a single stage version (a micro-electromechanical tunneling transistor switch) of the switch in FIG. 1. The contact gap is the same as for final actuation stage shown in FIGS. 2 and 3.

As illustrated in FIG. 7, a fully opened micro-electromechanical system tunneling transistor switch is shown having a variable curvature. The micro-electromechanical system tunneling transistor switch includes a cantilever 10.

The cantilever 10 may be multi-layer, constructed of a layer of (200 nm) titanium formed upon a layer of (600 nm) aluminum, which is formed upon a layer of (200 nm) titanium or a layer of (100 nm) titanium formed upon a layer of (800 nm) tungsten, which is formed upon a layer of (100 nm) titanium. It is noted that the area 1200 of cantilever 10 may be thinner to provide an increased curvature and a lower spring constant. By varying the thickness of the cantilever 10, the cantilever 10 can achieve a greater impedance change by having the cantilever 10 rise up further to give a small off-state capacitance while still having a relatively low actuation voltage.

The micro-electromechanical system tunneling transistor switch also includes a pull down electrode 3000. The pull down electrodes 3000 may be constructed of tantalum nitride. It is further noted that pull down electrode 3000 may provide independent actuation.

Lastly, micro-electromechanical system tunneling transistor switch includes a moving contact 3100 and a fixed contact 2100. Contact 2100 may be constructed of rhodium with an optional anti-stick layer. The anti-stick layer may consist of a silicon dioxide monolayer. The anti-stick layer may also consist of a monolayer layer of carbon or oxygen or both after cleaning.

By adding a very thin layer of fluoro polymer, less than 2 nm, or other non-stick coating to the surfaces, the surface energy is reduced. Moreover, the surface is roughened, thereby greatly reducing the stiction and allowing the spring force to dominate.

Since the first stages have been eliminated, this switch is a much faster switch while maintaining the anti-bounce characteristics. Depending on the size, such a switch could approach a switching speed of 1 Ghz. Since this switch is narrower, it will have fewer contacts and lower contact area and could have a higher resistance when the contacts are closed.

Figure 8:
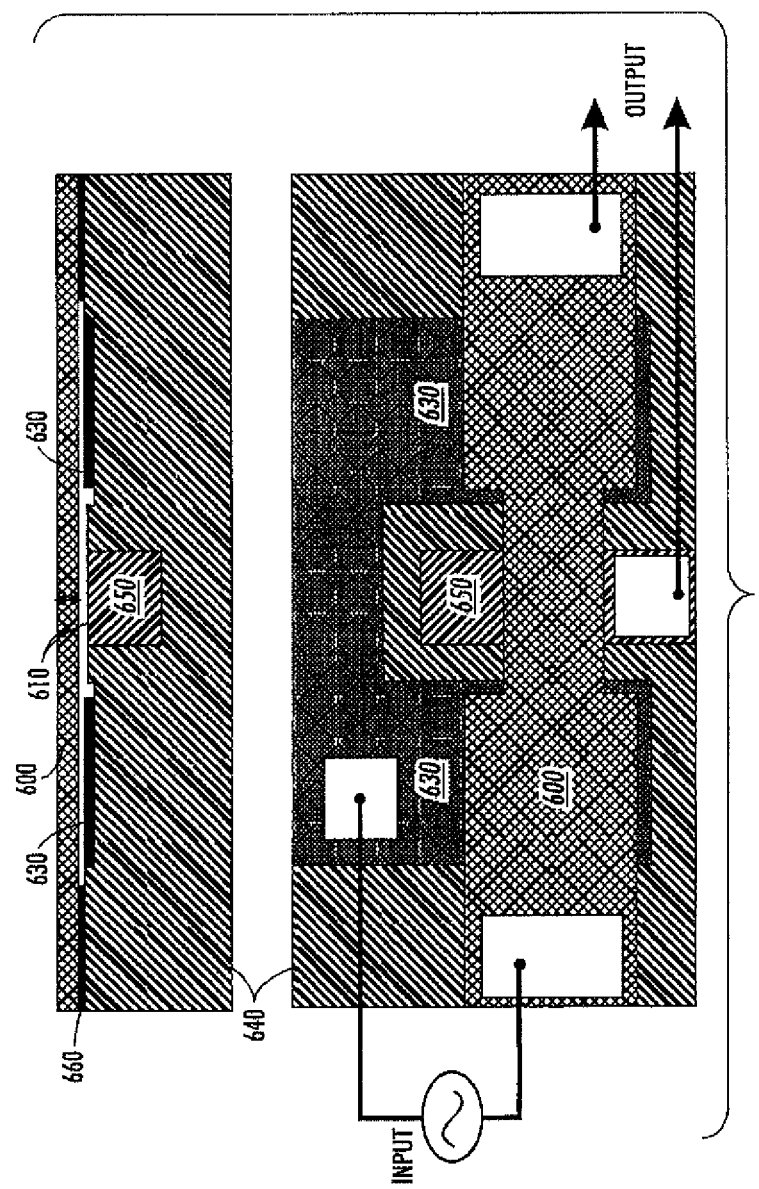
FIG. 8 illustrates a micro-electromechanical system tunneling transistor.

FIG. 8 is a top view and side view of a silicon version of a micro-electromechanical system tunneling transistor switch. As illustrated in FIG. 8, a micro-electromechanical system tunneling transistor switch is constructed wherein the contacts are between a silicon moving contact 600 and a n+ doped silicon fixed contact 650 embedded in an insulating or P type silicon 640. It is noted that the n+ doped silicon fixed contact 650 is slightly separated from the silicon moving contact 600 forming a gap 610. It is further noted that the gap area may include a stabilizing layer on the surfaces of silicon moving contact 600 and n+ doped silicon fixed contact 650. An oxide layer 660 is formed between the silicon moving contact 600 and the insulating or P type silicon 640.

As further illustrated in FIG. 8, the height of the gap can be modulated by varying a voltage applied to the modulating electrodes 630 and the silicon moving contact 600. The voltage, in conjunction with modulating electrodes 630 and the silicon moving contact 600, varies the height of gap, by causing the silicon moving contact 600 to move up and down.

It is noted that silicon moving contact 600 may be constructed of degenerately doped SOI or poly-silicon. It is further noted that silicon moving contact 600 may be constructed of ruthenium oxide, and the fixed contact 650 may be constructed of rhodium.

With respect to FIG. 8, the micro-electromechanical system tunneling transistor switch may include a very small gap, 2 nm or less, between two very flat and smooth degenerately doped silicon electrodes. By applying a small voltage to the modulation, actuation, pull down, electrodes, the silicon moving contact 600 (beam) is pulled down and the tunneling resistance decreases. If a voltage is present between the moving beam (silicon moving contact 600) and the fixed contact (n+ doped silicon fixed contact 650), the current between the contacts will increase, as the beam (silicon moving contact 600) is pulled down.

In the embodiment of FIG. 8, the dimension of the tunneling gap may have an area defined by a 0.1 micron square and is around 1 nm thick, with the additional condition that the actual gap will be smaller because there will a fairly strong van der Waals force across the gap between the two electrodes which will tend to bend the moving electrode downward. In this case, the moving member is made from ruthenium oxide, as noted above, which is a very good conductor and has a lower tendency to accumulate water and hydrocarbons from the atmosphere than platinum.

In addition, the ruthenium will not oxidize like a material such as titanium or tungsten. Oxidation of the surfaces in the gap is not desirable since the oxide will quickly fill the gap. It is noted that the moving member could also be made from a very low density material like titanium and coated with a super thin layer of ruthenium oxide.

The area of the actuation electrode gap may be twice as large as the tunneling gap in order to achieve the necessary forces for gap control and to minimize self-actuation due to a voltage across the tunneling gap.

Figure 9:
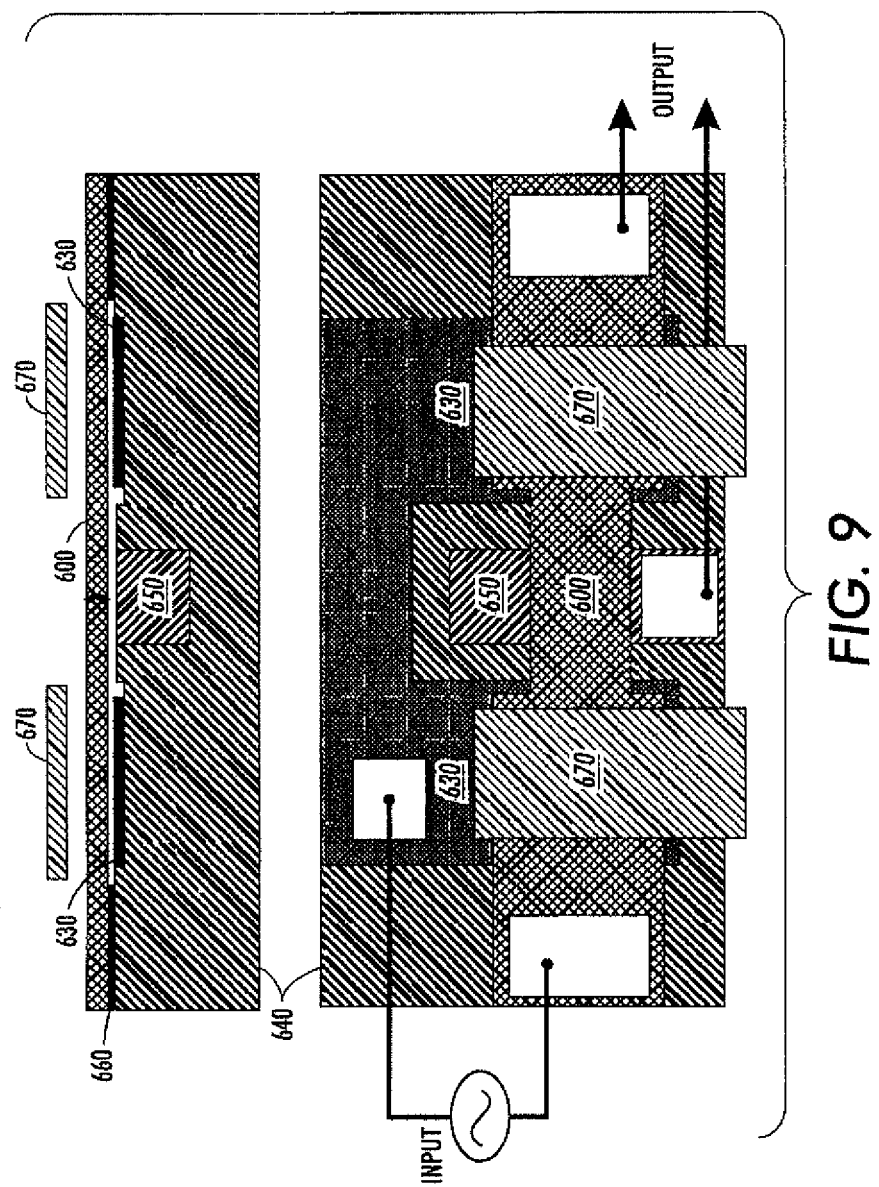
FIG. 9 illustrates another micro-electromechanical system tunneling transistor.

FIG. 9 is a top view and side view of a micro-electromechanical system tunneling transistor switch with pull up electrodes. As illustrated in FIG. 9, a micro-electromechanical system tunneling transistor switch is constructed wherein the contacts are between a silicon moving contact 600 and a n+ doped silicon fixed contact 650 embedded in an insulating or P type silicon 640. It is noted that the n+ doped silicon fixed contact 650 is slightly separated from the silicon moving contact 600 forming a gap 610. It is further noted that the gap area may include a stabilizing layer on the surfaces of silicon moving contact 600 and n+ doped silicon fixed contact 650. Pull up electrodes 670 are formed above the silicon moving contact 600. An oxide layer 660 is formed between the silicon moving contact 600 and the insulating or P type silicon 640.

As further illustrated in FIG. 9, the height of the gap can be modulated by varying a voltage applied to the modulating electrodes 630, pull up electrodes 670, and the silicon moving contact 600. The voltage, in conjunction with modulating electrodes 630, pull up electrodes 670, and the silicon moving contact 600, varies the height of gap, by causing the silicon moving contact 600 to move up and down.

It is noted that silicon moving contact 600 may be constructed of degenerately doped SOI or poly-silicon. It is further noted that silicon moving contact 600 may be constructed of ruthenium oxide, and the fixed contact 650 may be constructed of rhodium.

With respect to FIG. 9, the actuation electrodes 670 are above the moving electrode 600 instead of below. In this embodiment, the gap is opened by the actuation voltage rather than closed, which makes this is complementary device to that in FIG. 8. With these two devices (FIGS. 8 and 9), one can make complementary logic circuits, which are very important to have in order to minimize power consumption in logic circuits.

It is noted that in these devices, the actual device speed depends upon on the speed with which the electrode moves, which in turn depends upon a number of factors including the spring constant, the mass, the resonant frequency, and the stress in the moving electrode. Furthermore, these devices provide a huge gain per unit area of the transistor, low power dissipation, and high efficiency.

Figure 10:
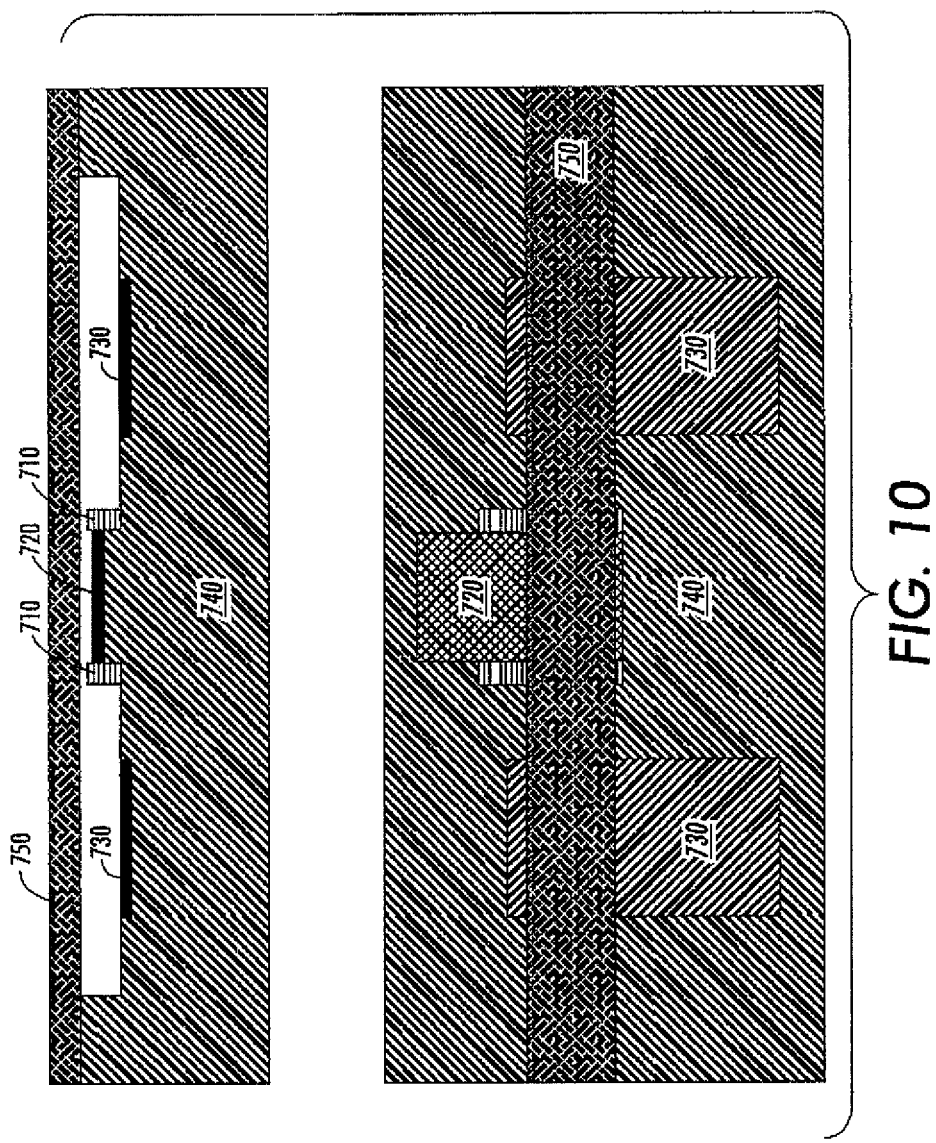
FIG. 10 illustrates a micro-electromechanical system tunneling transistor with pull-up electrodes.

FIG. 10 is a top view and side view of a micro-electromechanical system tunneling triode switch. As illustrated in FIG. 10, a micro-electromechanical system tunneling triode switch is constructed wherein the contacts are between platinum moving contact 750 and platinum fixed contact 720 embedded in a silicon dioxide 740. It is noted that the platinum fixed contact 720 is slightly separated from the platinum moving contact 750 forming a gap. It is further noted that the gap area may include a stabilizing layer on the surfaces of platinum fixed contact 720 and platinum moving contact 750.

The micro-electromechanical system tunneling triode switch also includes stops 710 located on either side of the platinum fixed contact 720. The stops 710 reduce the possibility that the beam (platinum moving contact 750) will lock down if the pull in, or actuation voltage, becomes too large.

As further illustrated in FIG. 10, the height of the gap can be modulated by varying a voltage applied to modulating electrodes 730. The voltage, in conjunction with modulating electrodes 730, varies the height of gap, by causing the platinum moving contact 750 to move up and down.

Figure 11:
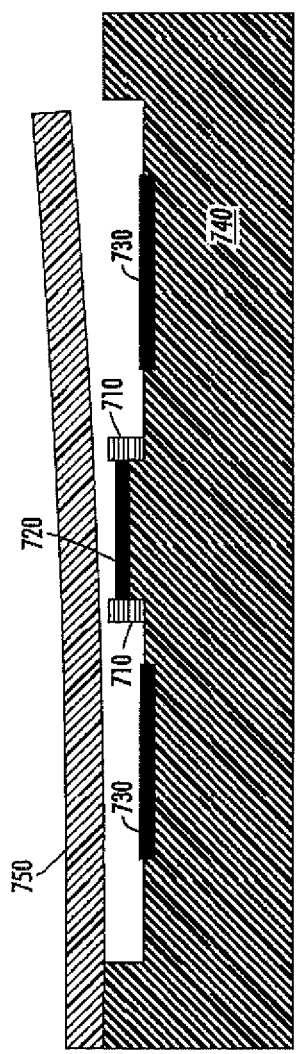
FIG. 11 illustrates a micro-electromechanical system tunneling triode with fixed-fixed beam.

FIG. 11 is a side view of another micro-electromechanical system tunneling triode switch with a cantilever beam. As illustrated in FIG. 11, a micro-electromechanical system tunneling triode switch is constructed wherein the contacts are between platinum cantilever 750 and platinum fixed contact 720 embedded in a silicon dioxide 740. It is noted that the platinum fixed contact 720 is slightly separated from the platinum cantilever 750 forming a gap. It is further noted that the gap area may include a stabilizing layer on the surfaces of platinum fixed contact 720 and platinum cantilever 750.

The micro-electromechanical system tunneling triode switch also includes stops 710 located on either side of the platinum fixed contact 720. The stops 710 reduce the possibility that the beam (platinum cantilever 750) will lock down if the pull in, or actuation voltage, becomes too large.

As further illustrated in FIG. 11, the height of the gap can be modulated by varying a voltage applied to modulating electrodes 730. The voltage, in conjunction with modulating electrodes 730, varies the height of gap, by causing the platinum cantilever 750 to move up and down. It is noted that the voltage can be applied independently to the modulating electrodes 730.

Figure 12:
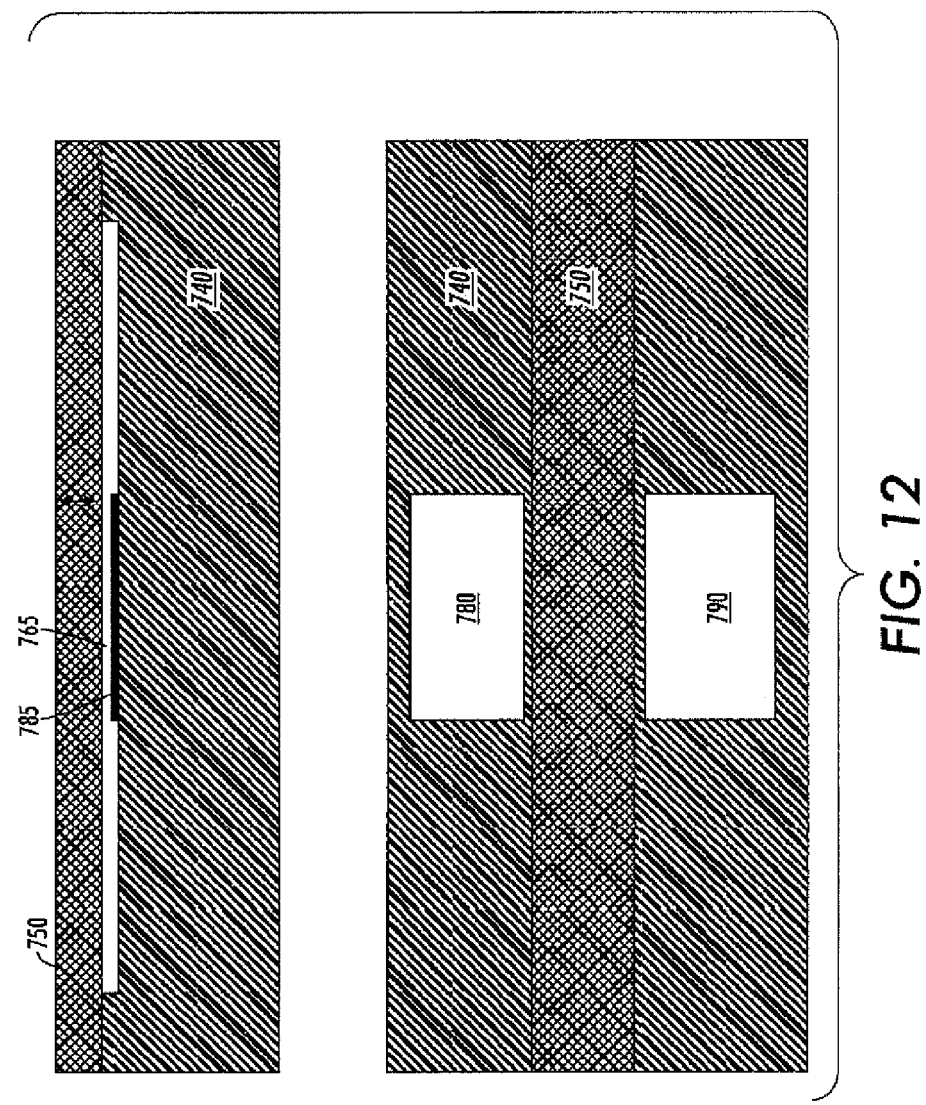
FIG. 12 illustrates a CMOS transistor converted to a MEMS test device.

FIG. 12 is a top view and side view of a CMOS transistor converted to a micro-electromechanical system test device. As illustrated in FIG. 12, a micro-electromechanical system test device is constructed wherein the contacts are between a moving poly-silicon contact 750 and a fixed silicon single crystal channel contact 785 embedded in a silicon dioxide 740. It is noted that the moving poly-silicon contact 750 is slightly separated from the fixed silicon single crystal channel contact 785 forming a gap 765.

It is further noted that the gap area may include a stabilizing layer on the surfaces of fixed silicon single crystal channel contact 785 and moving poly-silicon contact 750. The micro-electromechanical system test device also includes a drain region 780 and a source region 790 located on either side of the fixed silicon single crystal channel contact 785.

With respect to FIG. 12, a simple tunneling diode can, in principal, be made by simply removing the oxide under the gate of a transistor after the fabrication is complete, leaving a gap. Appling a voltage between the gate and the channel of the transistor would then actuate the gate, moving the gate closer to the channel and dramatically increasing the tunneling current, thereby creating a micro-electromechanical system tunneling diode.

Figure 13:
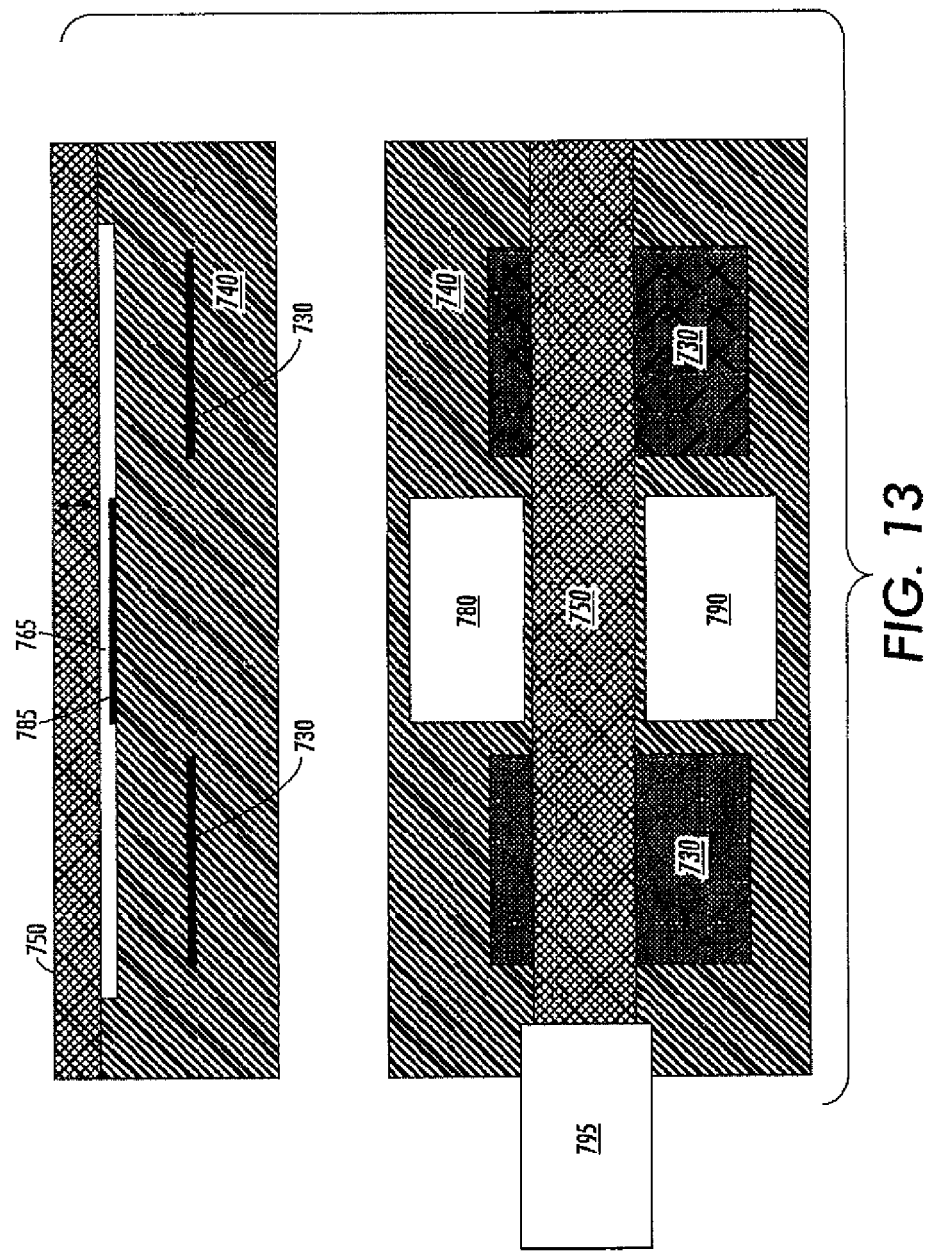
FIG. 13 illustrates a micro-electromechanical system tunneling transistor with fixed gate voltage.

FIG. 13 is a top view and side view of a micro-electromechanical system tunneling transistor. As illustrated in FIG. 13, a micro-electromechanical system tunneling transistor is constructed wherein the contacts are between a moving poly-silicon contact 750 and a fixed silicon single crystal channel contact 785 imbedded in a silicon dioxide 740. It is noted that the moving poly-silicon contact 750 is slightly separated from the fixed silicon single crystal channel contact 785 forming a gap 765. It is further noted that the gap area may include a stabilizing layer on the surfaces of fixed silicon single crystal channel contact 785 and moving poly-silicon contact 750. The micro-electromechanical system tunneling transistor also includes actuating electrodes 730 located on either side of the silicon single crystal channel contact 785. The actuating electrodes 730 may be constructed of niobium. Furthermore, the micro-electromechanical system tunneling transistor includes contact areas 795, 780, and 790.

In summary, the switch may a slightly curved shaped cantilever and the contact bumps (stops) on the bottom of the cantilever, staged in rows. The cantilever may be fifty microns long, and the rows may be about ten microns apart.

The actuation electrodes located below the cantilever are located between the stops so that there is no contact forming with the stops. When the cantilever actuates, by applying a voltage between the actuation electrodes and the cantilever (in the case where all the pull down electrodes are connected to the same voltage), the stops contact the surface of the insulator one at a time.

The bumps are made high enough so that there is no contact accruing between the actuation electrodes and the metal cantilever. The gap between the electrodes and the cantilever could be on the order of one hundred nanometers. As the cantilever rolls out in stages, the remaining part of the cantilever gets stiffer, resulting in the spring constant getting larger. In addition, the resonant frequency gets larger.

The moving contacts on the end of the cantilever move down in stages. As the last row of bumps contact the substrate, the moving contact is about thirty nanometers from the fixed contact. The cantilever in this last stage becomes extremely stiff in all directions, especially horizontally and longitudinally. Since of the gap between the actuator electrode and the cantilever is very narrow, the actuation field and the force can be quite high. Moreover, since the cantilever moves only thirty nanometers or less between the position illustrated in FIG. 2 and the position illustrated in FIG. 3, there is no snap actuation and very little if any bounce or contact scraping.

It is noted that there may be a natural layer or an intentional layer which prevents the metal atoms from actual physical contact, as illustrated in FIG. 5. Therefore, the contacts surfaces may be made to be smooth in order to achieve a low contact resistance.

It is possible that on the first few actuations if there is a small bump on the contact surface (for example a small bump that is 1-2 nm high and 5 nm wide), the small bump will be pressed flat in the first few actuations so that the average gap will be 1 nm or less between the fixed and moving contact metal surfaces.

It is also possible that the metal is resilient enough so that when in contact, small elastic movements of the metal occur, resulting in a surface that is effectively smoother.

The natural layer or intentional layer is effectively thin enough so that the resistance due to electron tunneling is small, thereby providing an effective gap. Contact areas where thickness for the effective gap is below 2 nm contribute to lowering the gap resistance. The smoothness of a surface is often given in terms of an rms value. The range of smoothness required for the tunneling switch is 0 to 2 nm.

As noted above, for some applications, it may be desirable to have a much smaller switch by shortening the cantilever, which would make the switch much faster. This switch does not actuate in stages; however, the switch has all the other properties, such as a movement distance in the range of 1 to 30 nm.

In the limit of this reduction in size, the contacts move only about 1 nm. The speed, size, and transconductance of such a small micro-electromechanical system switch begin to compare favorably with a transistor.

Moreover, the various embodiments described above provide contacts that come together, rather than having direct contact, with a very thin (a few monolayers thick) well controlled insulating layer provided between the contacts so that a tunnel junction is formed and there is a lower adhesion force than for direct contact. For example, some of the embodiments provide metal contacts that come together, rather than having direct metal-to-metal contact, with a very thin (a few monolayers thick) well controlled insulating layer provided between the metal contacts so that a tunnel junction is formed and there is a lower adhesion force than for direct metal-to-metal contact.

Also, the various embodiments described above protect the very thin insulating layer from damage by providing for the actuator to move the contact in stages so that the last stage has only a very small (less than 100 nm) controlled movement in a way which will eliminate contact bounce and greatly reduce the kinetic energy at contact. It is noted that the various embodiments described above provide the stop points on the cantilever. However, the stop points could also be provided on the substrate and/or fixed contact.

Moreover, the various embodiments described above provide contact surfaces made to be very smooth (less than 1 nm rms) and parallel so that there are no contact asperities and the force and current will be relatively uniform over the contact surface. Having the contact surfaces forces under control and fixed with no time dependent changes produces a predictable and repeatable contact adhesion force per unit area and contact resistance per unit area. The contacts can then be designed to match four design parameters: spring force available from the cantilever to separate the contacts, the required contact resistance, the current density to be carried by the contacts and the contact gap.

Furthermore, the various embodiments described above resolve the issue of carbon and oxygen impurities forming on the contact surfaces by using the appropriate cleaning techniques during the switch packaging step. The most likely candidates for the final clean are atomic hydrogen, atomic oxygen, or oxygen plasma probably with the sample at elevated temperature. These switches work properly if the contamination can be reduced to the range of 1 monolayer.

Thus, one possibility is that a monolayer of Teflon™ is formed as the insulator on the contacts after cleaning and just before sealing the package.

Lastly, it is noted that the effective gap formed by an intentional insulating tunneling layer is optional.

While various examples and embodiments have been shown and described, it will be appreciated by those skilled in the art that the spirit and scope of the embodiments are not limited to the specific description and drawings herein.

What is claimed is:

1. A micro-electromechanical system switch, comprising:
   a substrate;
   a plurality of actuating electrodes formed in said substrate, each actuating electrode being activatable;
   a cantilever beam having a first end and a second end, said first end of said cantilever beam being anchored to said substrate, said second end of said cantilever beam not being anchored to said substrate;
   a plurality of stops formed on said cantilever beam to engage said substrate between said plurality of actuating electrodes, said plurality of stops being a plurality of solid raised areas; and
   a contact area formed in said substrate and located to engage said second end of said cantilever beam to form an electrical switch;
   one of said plurality of stops being formed on said cantilever beam so as to provide contact to said contact area;
   said contact area having a metal contact surface, the metal contact surface having a smoothness of less than 1 nm rms;
   said cantilever beam being constructed of a first layer of titanium formed upon a second layer of tungsten, which is formed upon a third layer of titanium.

2. The micro-electromechanical system switch as claimed in claim 1, further comprising a voltage source to apply a voltage to each actuating electrode independently in a sequence from an actuating electrode located adjacent to said first end of said cantilever beam to an actuating electrode located adjacent to said second end of said cantilever beam so that said plurality of stops sequentially engage said substrate between said plurality of actuating electrodes.

3. The micro-electromechanical system switch as claimed in claim 2, wherein a gap is formed between a second end of said cantilever beam and said contact area when all actuating electrodes, but the actuating electrode located adjacent to said second end of said cantilever beam, have been actuated.

4. The micro-electromechanical system switch as claimed in claim 3, wherein said gap is less than 100 nm.

5. The micro-electromechanical system switch as claimed in claim 3, wherein said gap is 1 to 30 nm.

6. The micro-electromechanical system switch as claimed in claim 2, wherein an effective gap is formed between a second end of said cantilever beam and said contact area when all actuating electrodes have been actuated.

7. The micro-electromechanical system switch as claimed in claim 6, wherein said effective gap is less than 1 nm.

8. The micro-electromechanical system switch as claimed in claim 6, wherein said effective gap substantially prevents metal atoms in said second end of said cantilever from physically contacting metal atoms in said contact area.

9. The micro-electromechanical system switch as claimed in claim 1, further comprising a voltage source to apply a voltage to each actuating electrode independently in a sequence from an actuating electrode located adjacent to said first end of said cantilever beam to an actuating electrode located adjacent to said second end of said cantilever beam so that the micro-electromechanical system switch closes in stages.

10. The micro-electromechanical system switch as claimed in claim 1, wherein said plurality of stops is constructed of platinum.

11. The micro-electromechanical system switch as claimed in claim 1, wherein said contact area includes an anti-stick layer formed thereon.

12. The micro-electromechanical system switch as claimed in claim 11, wherein said anti-stick layer is constructed of a silicon dioxide monolayer.

13. The micro-electromechanical system switch as claimed in claim 11, wherein said anti-stick layer is constructed of a monolayer layer of carbon.

14. The micro-electromechanical system switch as claimed in claim 11, wherein said anti-stick layer is constructed of a monolayer layer of oxygen.

15. The micro-electromechanical system switch as claimed in claim 1, wherein said cantilever beam includes strain relieving slits.

16. The micro-electromechanical system switch as claimed in claim 1, wherein said first end of said cantilever beam is thinner than said second end of said cantilever beam.

17. The micro-electromechanical system switch as claimed in claim 1, wherein a thickness of said cantilever beam increase from said first end of said cantilever beam to said second end of said cantilever beam.

18. The micro-electromechanical system switch as claimed in claim 1, further comprising an anti-stick layer formed on said contact area.

19. The switch as claimed in claim 18, wherein said anti-stick layer is constructed of a silicon dioxide monolayer.

20. The switch as claimed in claim 18, wherein said anti-stick layer is constructed of a monolayer layer of carbon.

21. The switch as claimed in claim 18, wherein said anti-stick layer is constructed of a monolayer layer of oxygen.

22. The switch as claimed in claim 18, wherein an effective gap of less than 1 nm is formed by said anti-stick layer.

23. The switch as claimed in claim 18, wherein an effective gap is formed by said anti-stick layer;
    said effective gap substantially preventing metal atoms in said contact area from physically contacting metal atoms in said one of said plurality of stops being formed on said cantilever beam providing contact to said contact area.

24. The micro-electromechanical system switch as claimed in claim 1, wherein said contact area and said one of said plurality of stops being formed on said cantilever beam providing contact to said contact area having an effective gap there between when said contact area and said one of said plurality of stops being formed on said cantilever beam providing contact to said contact area provide a closed switch.

25. The switch as claimed in claim 24, wherein the effective gap is an anti-stick layer formed on said contact area.

26. The switch as claimed in claim 24, wherein the effective gap is an anti-stick layer formed on said one of said plurality of stops being formed on said cantilever beam providing contact to said contact area.

27. The switch as claimed in claim 24, wherein the effective gap substantially prevents metal atoms in said contact area and said one of said plurality of stops being formed on said cantilever beam providing contact to said contact area from actual physical contact.

28. The switch as claimed in claim 24, wherein the effective gap is realized by said contact area and said one of said plurality of stops being formed on said cantilever beam providing contact to said contact area are non-atomically smooth.

29. The switch as claimed in claim 24, wherein said contact area and said one of said plurality of stops being formed on said cantilever beam providing contact to said contact area having a gap there between which is less than 50 nm when said contact area and said one of said plurality of stops being formed on said cantilever beam providing contact to said contact area provide an open switch.

30. A micro-electromechanical system switch, comprising:
 a substrate;
 a plurality of actuating electrodes formed in said substrate, each actuating electrode being activatable;
 a cantilever beam having a first end and a second end;
 a plurality of stops formed on said substrate to engage said cantilever beam between said plurality of actuating electrodes; and
 a metal contact area formed in said substrate and located to engage said second end of said cantilever beam to form an electrical switch;
 said metal contact area having a metal contact surface, the metal contact surface having a smoothness of less than 1 nm rms;
 said cantilever beam being constructed of a first layer of titanium formed upon a second layer of tungsten, which is formed upon a third layer of titanium.

31. The micro-electromechanical system switch as claimed in claim 30, further comprising a voltage source to apply a voltage to each actuating electrode independently in a sequence from an actuating electrode located adjacent to said first end of said cantilever beam to an actuating electrode located adjacent to said second end of said cantilever beam so that said plurality of stops sequentially engage said substrate between said plurality of actuating electrodes.

32. The micro-electromechanical system switch as claimed in claim 31, wherein a gap is formed between a second end of said cantilever beam and said metal contact area when all actuating electrodes, but the actuating electrode located adjacent to said second end of said cantilever beam, have been actuated.

33. The micro-electromechanical system switch as claimed in claim 32, wherein said gap is less than 100 nm.

34. The micro-electromechanical system switch as claimed in claim 32, wherein said gap is 1 to 30 nm.

35. The micro-electromechanical system switch as claimed in claim 31, wherein an effective gap is formed between a second end of said cantilever beam and said metal contact area when all actuating electrodes have been actuated.

36. The micro-electromechanical system switch as claimed in claim 35, wherein said effective gap is less than 1 nm.

37. The micro-electromechanical system switch as claimed in claim 35, wherein said effective gap substantially prevents metal atoms in said second end of said cantilever from physically contacting metal atoms in said metal contact area.

38. The micro-electromechanical system switch as claimed in claim 30, further comprising a voltage source to apply a voltage to each actuating electrode independently in a sequence from an actuating electrode located adjacent to said first end of said cantilever beam to an actuating electrode located adjacent to said second end of said cantilever beam so that the micro-electromechanical system switch closes in stages.

39. The micro-electromechanical system switch as claimed in claim 30, wherein said plurality of stops is constructed of platinum.

40. The micro-electromechanical system switch as claimed in claim 30, wherein said metal contact area includes an anti-stick layer formed thereon.

41. The micro-electromechanical system switch as claimed in claim 40, wherein said anti-stick layer is constructed of a silicon dioxide monolayer.

42. The micro-electromechanical system switch as claimed in claim 40, wherein said anti-stick layer is constructed of a monolayer layer of carbon.

43. The micro-electromechanical system switch as claimed in claim 40, wherein said anti-stick layer is constructed of a monolayer layer of oxygen.

44. The micro-electromechanical system switch as claimed in claim 30, wherein said cantilever beam includes strain relieving slits.

45. The micro-electromechanical system switch as claimed in claim 30, wherein said first end of said cantilever beam is thinner than said second end of said cantilever beam.

46. The micro-electromechanical system switch as claimed in claim 30, wherein a thickness of said cantilever beam increase from said first end of said cantilever beam to said second end of said cantilever beam.

47. A micro-electromechanical system switch, comprising:
 a substrate;
 a plurality of actuating electrodes formed in said substrate, each actuating electrode being activatable;
 a cantilever beam having a first end and a second end;
 a plurality of stops formed on said substrate to engage said cantilever beam; and
 a metal contact area formed in said substrate and located to engage said second end of said cantilever beam;
 said metal contact area having a metal contact surface, the metal contact surface having a smoothness of less than 1 nm rms;
 said cantilever beam being constructed of a first layer of titanium formed upon a second layer of tungsten, which is formed upon a third layer of titanium.

48. The micro-electromechanical system switch as claimed in claim 47, wherein a gap is formed between a second end of said cantilever beam and said metal contact area, said gap being less than 100 nm.

49. The micro-electromechanical system switch as claimed in claim 47, wherein a gap is formed between a second end of said cantilever beam and said metal contact area, said gap being 1 to 30 nm.

50. The micro-electromechanical system switch as claimed in claim 47, wherein an effective gap is formed between a second end of said cantilever beam and said metal contact area when said actuating electrode has been actuated.

51. The micro-electromechanical system switch as claimed in claim 50, wherein said effective gap is less than 1 nm.

52. The micro-electromechanical system switch as claimed in claim 50, wherein said effective gap substantially prevents metal atoms in said second end of said cantilever from physically contacting metal atoms in said metal contact area.

53. The micro-electromechanical system switch as claimed in claim 47, wherein said plurality of stops is constructed of platinum.

54. A micro-electromechanical system switch, comprising:
 a substrate;

an actuating electrode formed in said substrate;

a cantilever beam having a first end and a second end;

a plurality of stops formed on said cantilever beam to engage said substrate; and a metal contact area formed in said substrate and located to engage said second end of said cantilever beam;

said metal contact area having a contact surface, the metal contact surface having a smoothness of less than 1 nm rms;

said cantilever beam being constructed of a first layer of titanium formed upon a second layer of tungsten, which is formed upon a third layer of titanium.

55. The micro-electromechanical system switch as claimed in claim 54, wherein a gap is formed between a second end of said cantilever beam and said metal contact area, said gap being less than 100 nm.

56. The micro-electromechanical system switch as claimed in claim 54, wherein a gap is formed between a second end of said cantilever beam and said metal contact area, said gap being 1 to 30 nm.

57. The micro-electromechanical system switch as claimed in claim 54, wherein an effective gap is formed between a second end of said cantilever beam and said metal contact area when said actuating electrode has been actuated.

58. The micro-electromechanical system switch as claimed in claim 57, wherein said effective gap is less than 1 nm.

59. The micro-electromechanical system switch as claimed in claim 57, wherein said effective gap substantially prevents metal atoms in said second end of said cantilever from physically contacting metal atoms in said metal contact area.

60. The micro-electromechanical system switch as claimed in claim 54, wherein said plurality of stops is constructed of platinum.

* * * * *